(12) United States Patent
Yamasaki et al.

(10) Patent No.: US 6,330,173 B1
(45) Date of Patent: *Dec. 11, 2001

(54) SEMICONDUCTOR INTEGRATED CIRCUIT COMPRISING STEP-UP VOLTAGE GENERATION CIRCUIT

(75) Inventors: Kyoji Yamasaki; Mikio Asakura, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/556,442

(22) Filed: Apr. 24, 2000

(30) Foreign Application Priority Data

Oct. 27, 1999  (JP) .................................................. 11-305697

(51) Int. Cl.[7] ............................. H02M 3/18; H02M 7/19
(52) U.S. Cl. ............................ 363/60; 363/59; 327/540; 327/589
(58) Field of Search ..................................... 327/536, 540, 327/589; 363/59, 60

(56) References Cited

U.S. PATENT DOCUMENTS

| | | | |
|---|---|---|---|
| 4,644,182 | * | 2/1987 | Kawashima et al. ................ 327/263 |
| 5,495,453 | * | 2/1996 | Wociechowski et al. ...... 365/185.18 |
| 5,729,172 | * | 3/1998 | Tsukada ................................. 327/536 |
| 5,777,930 | * | 7/1998 | Sugiura et al. ................. 365/189.11 |
| 5,909,141 | * | 6/1999 | Tomishima ........................... 327/536 |
| 5,959,854 | * | 9/1999 | Okada ................................... 363/60 |

FOREIGN PATENT DOCUMENTS 10-11967   1/1998   (JP) ............................. G11C/11/407

* cited by examiner

Primary Examiner—Peter S. Wong
Assistant Examiner—Bao Q. Vu
(74) Attorney, Agent, or Firm—McDermott, Will & Emery

(57) ABSTRACT

A VPP generation circuit included in the inventive semiconductor integrated circuit includes a VPP dividing circuit dividing a step-up voltage VPP, a VDDA dividing circuit dividing an array voltage VDDA supplied to a memory cell array area, a VREFD generation circuit generating a reference voltage VREFD on the basis of an output of the VDDA dividing circuit and a comparator part comparing the reference voltage VREFD with a voltage VPPn output from the VPP dividing circuit. Thus, the step-up voltage VPP can be changed in response to change of the array voltage VDDA.

22 Claims, 14 Drawing Sheets

SEMICONDUCTOR INTEGRATED CIRCUIT COMPRISING STEP-UP VOLTAGE GENERATION CIRCUIT

BACKGROUND OF THE INVENTION

1. Field of the Invention

The present invention relates to a semiconductor integrated circuit, and more particularly, it relates to a semiconductor integrated circuit comprising a circuit generating a step-up voltage.

2. Description of the Background Art

A DRAM (dynamic random access memory) employs a step-up voltage VPP having a higher level than an external power supply voltage EXTVCC for driving a word line and/or for an output circuit.

As shown in FIG. 14, a conventional VPP generation circuit generating such a step-up voltage VPP includes a sensing part 90 sensing the level of the step-up voltage VPP, a ring oscillator 95 and a pumping circuit 96.

When the step-up voltage VPP falls below a prescribed reference voltage level, the sensing part 90 senses this and generates an enable signal VPPOSCE enabling the ring oscillator 95.

As shown in FIG. 15, the ring oscillator 95 is formed by a NAND circuit 97 and a plurality of serially connected inverters 98#1 to 98#6. The NAND circuit 97 receives the enable signal VPPOSCE and an output of the inverter 98#6. When the ring oscillator 95 operates, the inverter 98#6 outputs a pulse waveform (pulse signal φ) of a constant cycle.

Referring again to FIG. 14, the pumping circuit 96 performs pumping on the basis of the pulse signal φ generated from the ring oscillator 95. Thus, charges are supplied to a VPP node for supplying the step-up voltage VPP. Consequently, the step-up voltage VPP corresponding to a prescribed reference voltage VREFD is obtained.

The sensing part 90 includes a sensing circuit 91 operating in a standby state and a sensing circuit 92 operating when an act command ACT is issued (in operation, i.e., when an external row address strobe signal/RAS is low).

As shown in FIG. 16, the sensing circuit 91 includes a comparator 74 provided between the external power supply voltage EXTVCC and a node N1, a constant current source 75 provided between the node N1 and a ground voltage GND and an inverter 76.

The comparator 74 is formed by transistors 70 and 71, a transistor 72 receiving the voltage VPPn obtained by dividing the step-up voltage VPP in its gate electrode and a transistor 73 receiving the reference voltage VREFD in its gate electrode. The inverter 76 inverts a signal on a node N2 between the transistors 71 and 73 and outputs the enable signal VPPOSCE.

As shown in FIG. 17, the sensing circuit 92 is formed by a comparator 74, a constant current source 79, a transistor 80 provided between a node N1 and the constant current source 79 for receiving the act command ACT in its gate electrode and an inverter 76.

As a current flowing to the comparator controlled by the constant current source is increased, the response speed (the time required for the signal VPPOSCE to go high after the step-up voltage VPP falls below the reference voltage VREFD) of the sensing circuit is increased.

In order to improve the response when receiving the act command, therefore, the constant current source 79 feeding a large current (about 10 μA) is employed for the sensing circuit 92. On the other hand, the constant current source 75 feeding a small current (about 2 μA) is employed for the standby sensing circuit 91 for reducing power consumption.

As shown in FIG. 18, a conventional VREFD generation circuit 850 generating the reference voltage VREFD includes a constant current source 84, a resistive element 85 and a PMOS transistor 86 with the ground voltage GND in its gate electrode.

Assuming that the array voltage VDDA which is employed for writing high-level information in a memory cell, is 2.5 V, for example, the step-up voltage VPP must be set to about (VDDA+2|Vtn|)=4.5 V, where Vtn represents the threshold voltage of a memory cell transistor.

The constant current source 84, the resistive element 85 and the transistor 86 are connected between the external power supply voltage EXTVCC and the ground voltage GND. A node N4 between the constant current source 84 and the resistive element 85 outputs the reference voltage VREFD. Assuming that I represents the current of the constant current source 84, R represents the resistance value of the resistive element 85 and Vtp represents the threshold voltage of the transistor 86, the reference voltage VREFD is expressed as follows:

$$VREFD = R \times I + |Vtp| \qquad (1)$$

Assuming that the step-up voltage VPP is 4.5 V, the voltage to be sensed is (½×VPP) and the absolute value |Vtp| is 0.8 V, however, the following equation (2) must be satisfied from the equation (1):

$$(R \times I) = 1.45V \qquad (2)$$

In order to form the VREFD generation circuit 850 according to the equation (2), a resistive element having a high resistance value is necessary. Therefore, the resistive element must be formed by a transistor having a large gate length, disadvantageously leading to a large layout area. When increasing the absolute value |Vtp| of the threshold voltage in order to solve this problem, the reference voltage VREFD may conceivably be varied with the temperature due to high temperature dependency of the absolute value |Vtp|.

Further, the reference voltage VREFD output from the VREFD generation circuit 850 is independent of a voltage related to a memory cell array, as shown in the equation (1). Therefore, when the array voltage is increased (particularly by temperature dependency in a test mode or a general operation mode), for example, the difference (VPP−VDDA) is reduced. Thus, charges written in the memory cell are disadvantageously reduced.

SUMMARY OF THE INVENTION

Accordingly, an object of the present invention is to provide a semiconductor integrated circuit having a small layout area, which can change a step-up voltage VPP in response to the voltage of a memory cell array area.

The semiconductor integrated circuit according to the present invention comprises a memory cell array area including a plurality of memory cells arranged in rows and columns, a plurality of word lines provided in correspondence to the rows and a plurality of bit lines provided in correspondence to the columns, a voltage generation circuit generating a voltage to be supplied to the memory cell array area and a step-up voltage generation circuit for generating a step-up voltage, and the step-up voltage generation circuit includes a sensing circuit sensing a level of the step-up voltage by comparing a voltage generated in accordance with an output from the voltage generation circuit with a voltage obtained by dividing the step-up voltage and a circuit operating in accordance with an output of the sensing circuit for raising the level of the step-up voltage.

According to the aforementioned semiconductor integrated circuit, therefore, the step-up voltage VPP can be changed in response to change of the voltage supplied to the memory cell array area. Further, voltage reduction can be attained by employing the voltage obtained by dividing the step-up voltage when sensing change of the step-up voltage.

Preferably, the step-up voltage is supplied to a selected word line among the plurality of word lines, the voltage generation circuit generates an array voltage to be written in a selected memory cell among the plurality of memory cells, and the sensing circuit includes a step-up voltage dividing circuit dividing the step-up voltage, an array voltage dividing circuit dividing the array voltage, a reference voltage generation circuit generating a reference voltage on the basis of an output of the array voltage dividing circuit and a compare circuit comparing the reference voltage with an output of the step-up voltage dividing circuit.

According to the aforementioned semiconductor integrated circuit, therefore, the reference voltage is generated on the basis of the voltage obtained by dividing the array voltage VDDA. Thus, the step-up voltage can be changed in response to change of the array voltage VDDA. Consequently, write charges in the memory cell can be kept constant.

In particular, the step-up voltage dividing circuit outputs a voltage obtained by dividing the step-up voltage substantially by n, where n represents a real number larger than 1.

Alternatively, the step-up voltage dividing circuit outputs a voltage obtained by dividing the step-up voltage substantially by n, where n represents a real number larger than 1, and the array voltage dividing circuit outputs a voltage obtained by dividing the array voltage substantially by n. The reference voltage generation circuit outputs a voltage obtained by adding the voltage obtained by dividing the array voltage substantially by n and a prescribed voltage to each other as the reference voltage.

According to the aforementioned semiconductor integrated circuit, therefore, the sizes of the components can be suppressed by comparing the voltage obtained by dividing the step-up voltage VPP with the reference voltage generated on the basis of the voltage obtained by dividing the array voltage VDDA.

Further, the reference voltage can be finely adjusted by adding the prescribed voltage to the voltage obtained by dividing the array voltage VDDA for obtaining the reference voltage.

Preferably, the step-up voltage is supplied to a selected word line among the plurality of word lines, the voltage generation circuit includes an internal reference voltage generation circuit generating an internal reference voltage on the basis of an external power supply voltage and a circuit generating an array voltage to be written in a selected memory cell among the plurality of memory cells on the basis of the internal reference voltage, and the sensing circuit includes a step-up voltage dividing circuit dividing the step-up voltage, a dividing circuit dividing the internal reference voltage, a reference voltage generation circuit generating a reference voltage on the basis of an output of the dividing circuit and a compare circuit comparing the reference voltage with an output of the step-up voltage dividing circuit.

According to the aforementioned semiconductor integrated circuit, therefore, the step-up voltage VPP can be changed in response to a voltage obtained by dividing the internal reference voltage.

Preferably, the step-up voltage is supplied to a selected word line among the plurality of word lines, the voltage generation circuit generates an array voltage to be written in a selected memory cell among the plurality of memory cells, the sensing circuit includes a step-up voltage dividing circuit dividing the step-up voltage, an array voltage dividing circuit dividing the array voltage and a compare circuit comparing an output of the step-up voltage dividing circuit with an output of the array voltage dividing circuit, and the compare circuit includes a current mirror circuit having a first transistor and a second transistor, a constant current source provided between the first transistor and an external power supply voltage for feeding a prescribed current, a resistive element connected to a node receiving the output of the step-up voltage dividing circuit, a third transistor provided between the resistive element and the second transistor for receiving the output of the array voltage dividing circuit in its gate and a node outputting a current flowing in the third transistor as a result of the comparison.

According to the aforementioned semiconductor integrated circuit, therefore, the step-up voltage VPP can be changed by comparing the voltage obtained by dividing the array voltage with the voltage obtained by dividing the step-up voltage with the current mirror circuit.

Preferably, each of the plurality of memory cells includes a memory cell transistor and a memory cell capacitor, the voltage generation circuit generates a cell plate voltage of the memory cell capacitor, and the sensing circuit compares the cell plate voltage with a voltage obtained by dividing the step-up voltage. In particular, the step-up voltage is supplied to a selected word line among the plurality of word lines, and the sensing circuit includes a step-up voltage dividing circuit outputting a voltage obtained by substantially halving the step-up voltage, a reference voltage generation circuit generating a reference voltage on the basis of the cell plate voltage and a compare circuit comparing the reference voltage with the output of the step-up voltage dividing circuit. The cell plate voltage is a voltage substantially half an array voltage to be written in a selected memory cell. In particular, the reference voltage generation circuit outputs a voltage obtained by adding a prescribed voltage to the cell plate voltage as the reference voltage.

According to the aforementioned semiconductor integrated circuit, therefore, the step-up voltage VPP can be changed in response to change of the cell plate voltage VCP by comparing the cell plate voltage VCP with the voltage obtained by dividing the step-up voltage. Further, the layout area can be suppressed.

Further, the reference voltage can be finely adjusted by adding a prescribed voltage to the cell plate voltage VCP for obtaining the reference voltage.

Preferably, the voltage generation circuit generates a precharge voltage supplied to the plurality of bit lines, and the sensing circuit compares the precharge voltage with a voltage obtained by dividing the step-up voltage. In particular, the step-up voltage is supplied to a selected word line among the plurality of word lines, and the sensing circuit includes a step-up voltage dividing circuit outputting a voltage obtained by substantially halving the step-up voltage, a reference voltage generation circuit generating a reference voltage on the basis of the precharge voltage and a compare circuit comparing the reference voltage with the output of the step-up voltage dividing circuit. The precharge voltage is a voltage substantially half an array voltage to be written in a selected memory cell. In particular, the reference voltage generation circuit outputs a voltage obtained by adding a prescribed voltage to the precharge voltage as the reference voltage.

According to the aforementioned semiconductor integrated circuit, therefore, the step-up voltage VPP can be changed in response to change of the precharge voltage VBL by comparing the precharge voltage VBL for the bit lines with the voltage obtained by dividing the step-up voltage. Further, the layout area can be suppressed.

In addition, the reference voltage can be finely adjusted by adding a prescribed voltage to the precharge voltage VBL for obtaining the reference voltage.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
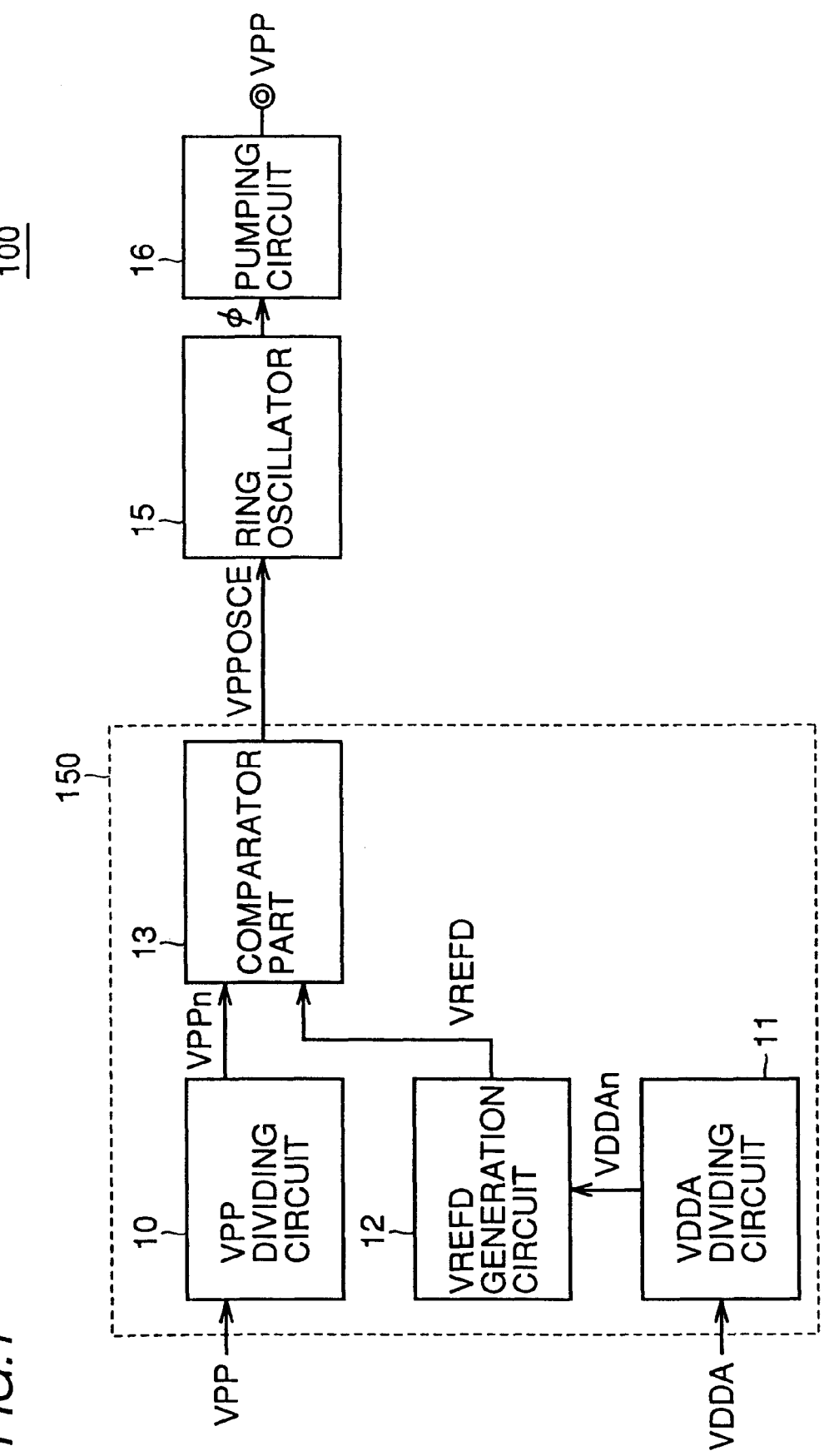
FIG. 1 is a block diagram showing an exemplary structure of a VPP generation circuit 100 according to a first embodiment of the present invention.

Embodiments of the present invention are described in detail with reference to the drawings. In the drawings, identical or corresponding parts are denoted by the same reference numerals, and redundant description is not repeated.

First Embodiment

An exemplary structure of a VPP generation circuit 100 according to a first embodiment of the present invention is described with reference to FIG. 1. As shown in FIG. 1, the VPP generation circuit 100 includes a sensing circuit 150 sensing reduction of a step-up voltage VPP and generating an enable signal VPPOSCE, a ring oscillator 15 activated in response to the enable signal VPPOSCE for outputting a pulse signal $\phi$ and a pumping circuit 16 raising the level of the step-up voltage VPP by the pulse signal $\phi$. The pumping circuit 16 performs pumping by the pulse signal $\phi$, for supplying charges to a VPP node for supplying the step-up voltage VPP.

The sensing circuit 150 includes a VPP dividing circuit 10 dividing the step-up voltage VPP, a VDDA dividing circuit 11 dividing an array voltage VDDA, a VREFD generation circuit 12 generating a reference voltage VREFD in response to an output of the VDDA dividing circuit 11 and a comparator part 13 sensing that a voltage VPPn output from the VPP dividing circuit 10 falls below the reference voltage VREFD and outputting the enable signal VPPOSCE.

The VPP generation circuit 100 according to the first embodiment of the present invention generates a desired step-up voltage VPP by comparing a voltage obtained by dividing the step-up voltage VPP with the reference voltage VREFD generated on the basis of a voltage obtained by dividing the array voltage VDDA.

An exemplary semiconductor integrated circuit 1000 having the VPP generation circuit 100 is described with reference to FIG. 2. The semiconductor integrated circuit 1000 shown in FIG. 2 comprises a control circuit 1 capturing external control signals received from external control pins and outputting corresponding internal control signals, an address buffer 2 capturing external addresses A0 to AK and outputting internal address signals, a memory cell array 3 including a plurality of memory cells arranged in rows and columns, a row-system control circuit 4 performing selection and control in the row direction of the memory cell array 3, a column-system control circuit 5 performing selection and control in the column direction of the memory cell array 3, a voltage generation circuit 6 and the VPP generation circuit 100.

The control circuit 1 receives an external row address strobe signal /RAS, an external column address strobe signal /CAS, an external chip selection signal /CS, an external write enable signal /WE and the like, for example.

Figure 3:
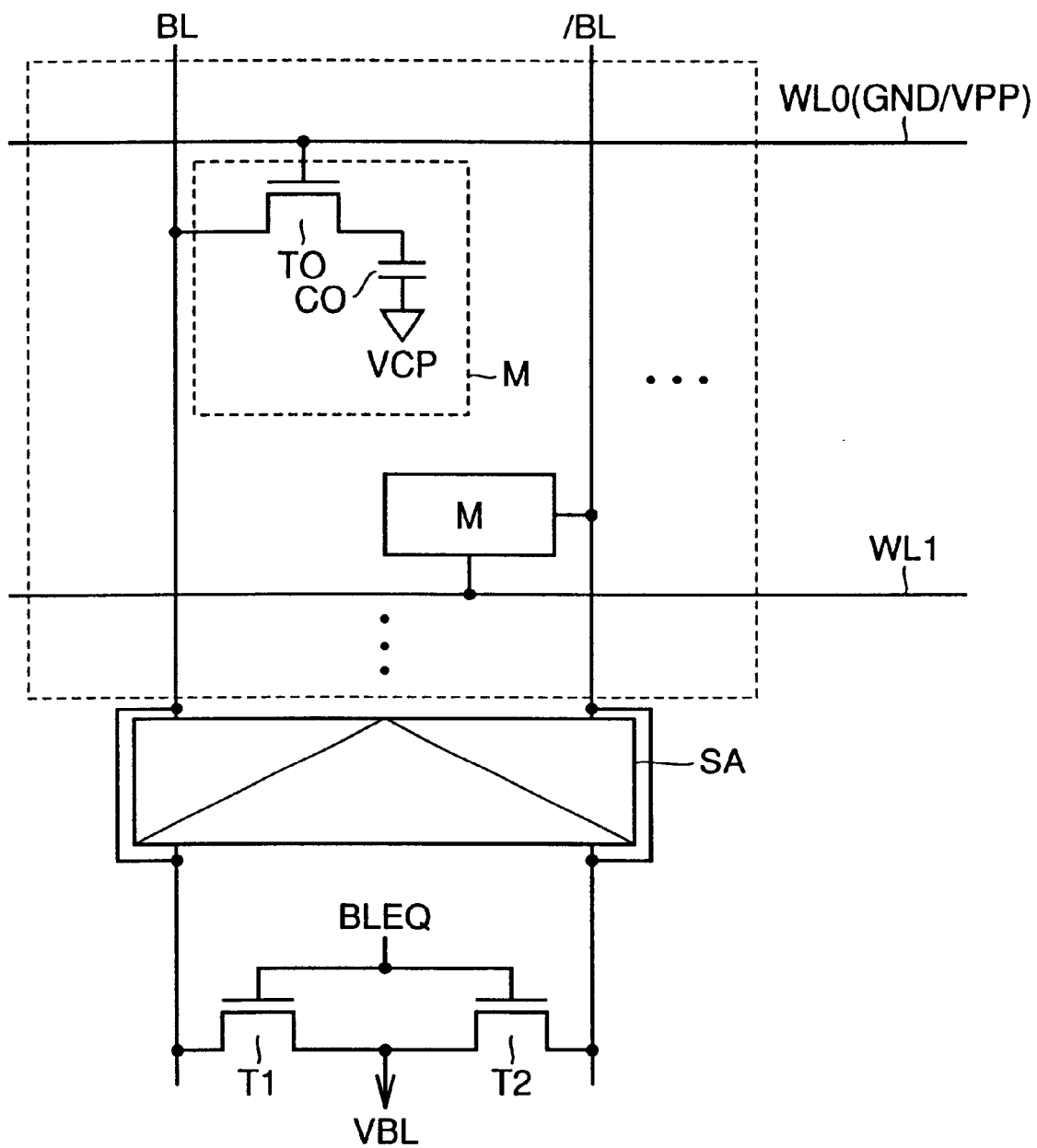
FIG. 3 is a diagram for illustrating a memory cell array 3 and a peripheral circuit thereof.

As shown in FIG. 3, the memory cell array 3 includes a plurality of memory cells M each formed by a memory cell transistor T0 and a memory cell capacitor C0, a plurality of word lines arranged in the row direction and a plurality of pairs of bit lines arranged in the column direction. FIG. 3 representatively illustrates word lines WL0 and WL1 and a pair of bit lines BL and /BL.

The memory cell transistor T0 is connected between the corresponding bit line and the memory cell capacitor C0, and enters an ON state in response to the voltage level of the corresponding word line. The row-system control circuit 4 sets the word lines at the step-up voltage VPP or a ground voltage GND. A cell plate voltage VCP is supplied to a cell plate side of the memory cell capacitor C0.

A sense amplifier SA is arranged in correspondence to the pair of bit lines BL and /BL. The sense amplifier SA differentially amplifies the potentials of the pair of bit lines BL and /BL. An equalize and precharge circuit formed by transistors T1 and T2 is arranged for the pair of bit lines BL and /BL. A precharge voltage VBL is supplied to a node between the transistors T1 and T2. The transistors T1 and T2 enter ON states in response to a bit line equalize signal BLEQ. When the bit line equalize signal BLEQ goes high, the pair of bit lines BL and /BL are set at the precharge voltage VBL.

In a standby state, the equalize and precharge circuit precharges the pair of bit lines BL and /BL to the level of the precharge voltage VBL. The control circuit 1 starts row selection. The precharge operation for the pair of bit lines BL and /BL is stopped (the transistors T1 and T2 are turned off) in advance of the start of row selection.

In response to a row address signal output from the address buffer 2, the row-system control circuit 4 activates the corresponding word line. Thus, the potential of the selected word line is raised to the level of the step-up voltage VPP.

When the word line WL0 is selected, the memory cell transistor T0 enters an ON state and the memory cell capacitor C0 is connected to the bit line BL. In a read operation, the potential of the bit line BL changes in response to charges stored in the memory cell M. The potential of the bit line /BL remains at the precharge level (VBL). The sense amplifier SA is activated to differentially amplify the potential difference between the pair of bit lines BL and /BL. The column-system control circuit 5 outputs a column selection signal in response to a column address signal output from the address buffer 2. In response to the column selection signal, read data of the corresponding column is output.

In a write operation, the potentials of the pair of bit lines corresponding to the selected column are changed in response to externally input data. Thus, the memory cell capacitor C0 included in the selected memory cell stores information corresponding to a high or low level.

The bit line BL is set at the array voltage VDDA for storing high-level information in the memory cell capacitor C0 of the memory cell M connected to the word line WL0 and the bit line BL or set at the ground voltage GND for storing low-level information therein.

Figure 2:
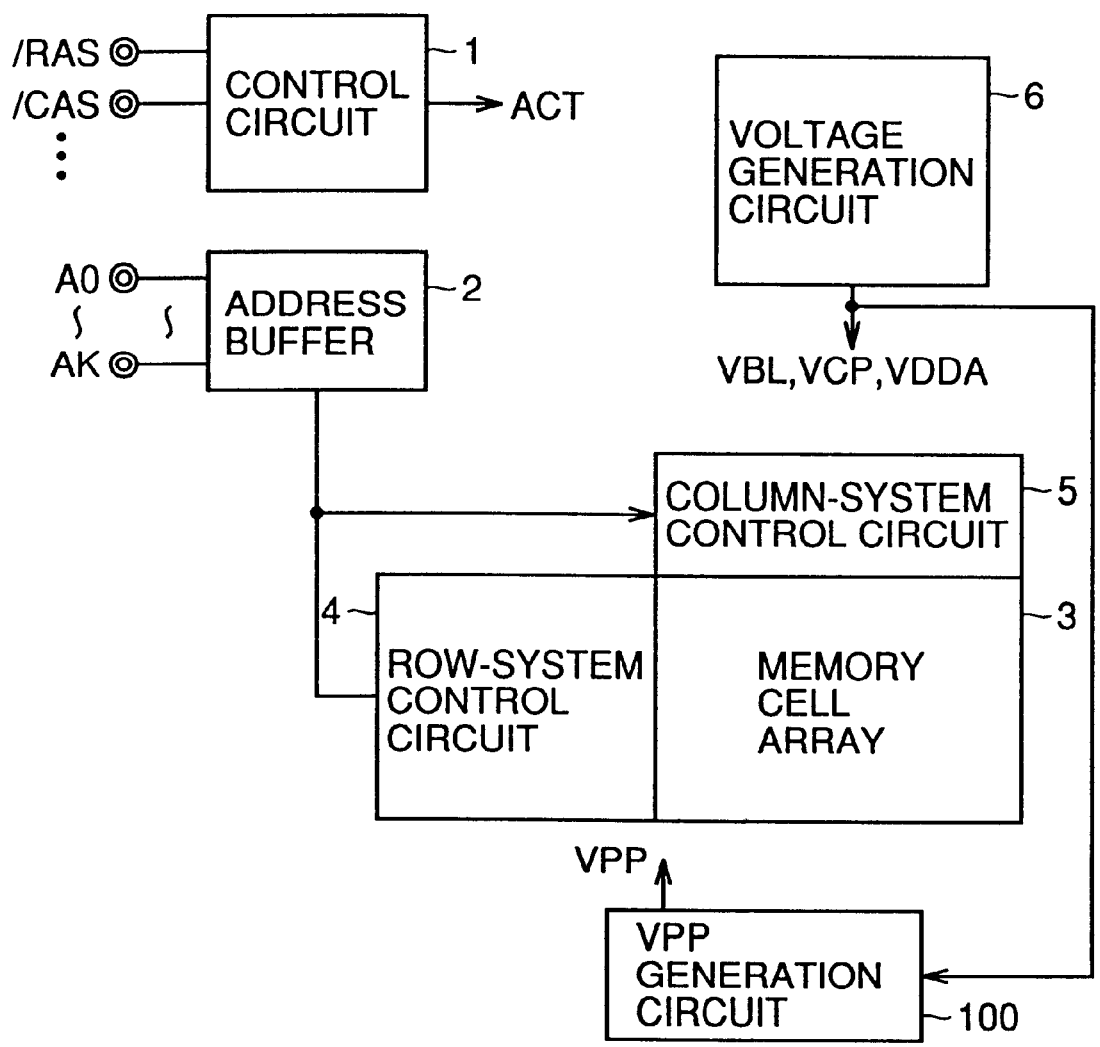
FIG. 2 is a block diagram showing an outline of the structure of a semiconductor integrated circuit 1000 according to the first embodiment of the present invention.

The voltage generation circuit 6 shown in FIG. 2 generates the precharge voltage VBL for the bit lines, the cell plate voltage VCP of the memory cell capacitor and the array voltage VDDA. The VPP generation circuit 100 generates the step-up voltage VPP in response to the array voltage VDDA.

Figure 4:
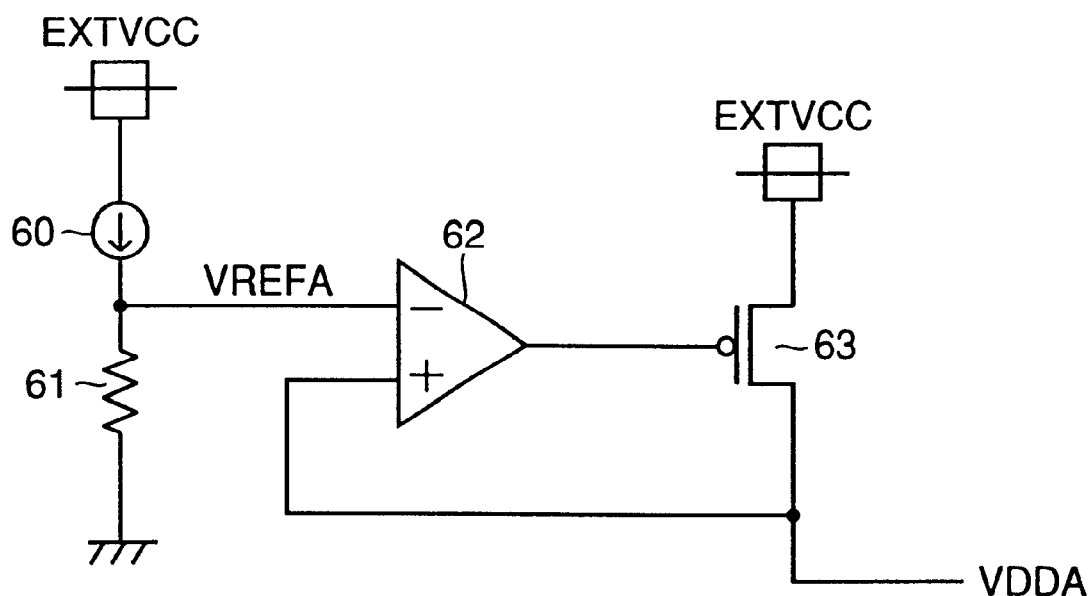
FIG. 4 is a diagram for illustrating a circuit generating an array voltage VDDA.

The voltage generation circuit 6 includes a circuit shown in FIG. 4. The circuit shown in FIG. 4 includes a constant current source 60, a resistive element 61 and a VDC circuit formed by a differential amplifier 62 and a PMOS transistor 63.

The constant current source 60 and the resistive element 61 are connected between an external power supply voltage EXTVCC and the ground voltage GND. A node between the constant current source 60 and the resistive element 61 outputs the internal reference voltage VREFA. The differential amplifier 62 amplifies the difference between the array voltage VDDA received in a positive input terminal and the internal reference voltage VREFA received in a negative input terminal. The transistor 63 is connected between the external power supply voltage EXTVCC and a node outputting the array voltage VDDA, and enters an ON state in response to an output of the differential amplifier 62.

An exemplary structure of the VPP dividing circuit 10 shown in FIG. 1 is described with reference to FIG. 5. The VPP dividing circuit 10 shown in FIG. 5 includes PMOS transistors 20 and 21. The transistors 20 and 21 are connected between the step-up voltage VPP and the ground voltage GND. The ground voltage GND is supplied to gate electrodes of the transistors 20 and 21. A node between the transistors 20 and 21 outputs the voltage VPPn.

Assuming that L0 and W0 represent the channel length and the channel width of the transistor 20 and L1 and W1 represent the channel length and the channel width of the transistor 21 respectively, the voltage VPPn reaches (½)× VPP by setting the ratio L0/W0 equal to the ratio L1/W1.

An exemplary structure of the VDDA dividing circuit 11 shown in FIG. 1 is described with reference to FIG. 6. The VDDA dividing circuit 11 shown in FIG. 6 includes PMOS transistors 22 and 23. The transistors 22 and 23 are connected between the array voltage VDDA and the ground voltage GND. The ground voltage GND is supplied to gate electrodes of the transistors 22 and 23. A voltage VDDAn is obtained from a node between the transistors 22 and 23. The voltage VDDAn reaches (½)×VDDA by adjusting the size of the transistors 22 and 23.

Figure 7:
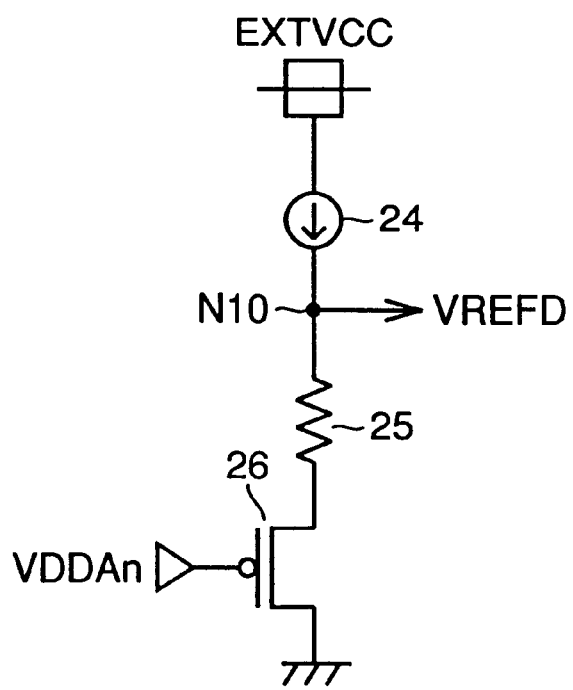
FIG. 7 is a circuit diagram showing an exemplary structure of a VREFD generation circuit 12 according to the first embodiment of the present invention.

An exemplary structure of the VREFD generation circuit 12 shown in FIG. 1 is described with reference to FIG. 7. The VREFD generation circuit 12 shown in FIG. 7 includes a constant current source 24 feeding a constant current I, a resistive element 25 having a resistance value R and a PMOS transistor 26. The VREFD generation circuit 12 generates the reference voltage VREFD in response to the voltage VDDAn received from the VDDA dividing circuit 11.

The constant current source 24 is connected between the external power supply voltage EXTVCC and a node N10. The resistive element 25 is connected between the node N10 and one conducting terminal of the transistor 26. The transistor 26 is connected between the resistive element 25 and the ground voltage GND, and receives the voltage VDDAn in its gate electrode. The transistor 26 has a threshold voltage Vtp. The node N10 outputs the reference voltage VREFD. The reference voltage VREFD satisfies the following equation (3):

$$\text{VREFD} = \text{VDDAn} + |\text{Vtp}| + R \times I \qquad (3)$$

Figure 5:
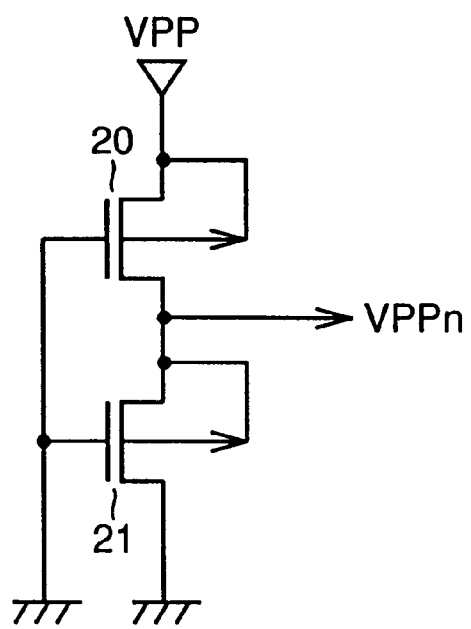
FIG. 5 is a circuit diagram showing an exemplary structure of a VPP dividing circuit 10 according to the first embodiment of the present invention.
Figure 6:
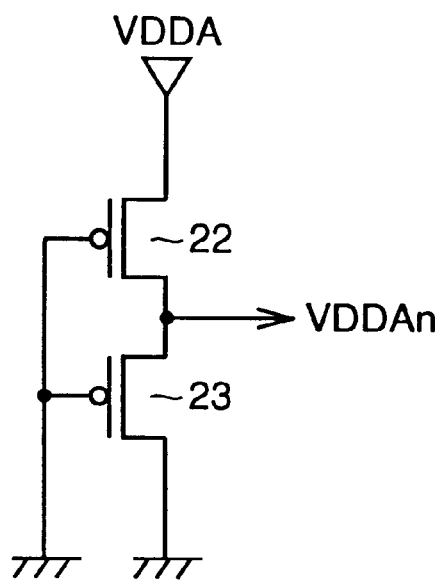
FIG. 6 is a circuit diagram showing an exemplary structure of a VDDA dividing circuit 11 according to the first embodiment of the present invention.

Assuming that the array voltage VDDA is 2.5 V, the voltage VDDAn output from the VDDA dividing circuit 11 shown in FIG. 6 is 1.25 V, the step-up voltage VPP is 4.5 V, and the voltage VPPn output from the VPP dividing circuit 10 shown in FIG. 5 is 2.25 V. Hence, the following equation (4) is obtained from the equation (3):

$$(|\text{Vtp}| + R \times I) = 1V \qquad (4)$$

The VREFD generation circuit 12 is structured to satisfy the equation (4). Therefore, the resistance value R of the resistive element 25 can be smaller than that of the resistive element included in the conventional VREFD generation circuit. Further, the absolute value |Vtp| of the threshold voltage may not be increased, and hence temperature dependency can be suppressed.

The following relation holds between change (ΔVDDA) of the array voltage VDDA and change (ΔVPP) of the step-up voltage VPP, where 2×VDDAn=VDDA:

$$\Delta VPP = \Delta(2 \times VREFD) \quad (5)$$

$$= 2 \times \Delta(VDDAn + |Vtp| + R \times I) \quad (6)$$

$$= \Delta VDDA + 2 \times \Delta(|Vtp| + R \times I) \quad (7)$$

|Vtp|+RI in the equation (7) is independent of the voltage change. Hence, the following equation (8) holds:

$$\Delta VPP = \Delta VDDA \quad (8)$$

When the array voltage VDDA is raised, the step-up voltage VPP is also raised by this increase of the array voltage VDDA. Consequently, the difference (VPP−VDDA) remains constant regardless of the increase of the array voltage VDDA.

The VDDA dividing circuit 11 divides the array voltage VDDA for generating the reference voltage VREFD. In the structure shown in FIG. 6, the internal reference voltage VREFA for generating the array voltage VDDA may alternatively be divided in place of the array voltage VDDA. In this case, the reference voltage VREFD can be stably obtained.

The comparator part 13 shown in FIG. 1 compares the voltage VPPn with the reference voltage VREFD expressed in the equation (3), and outputs a high-level enable signal VPPOSCE when the voltage VPPn falls below the reference voltage VREFD.

The ring oscillator 15 shown in FIG. 1 may be identical in structure to the ring oscillator 95, for example. The pumping circuit 16 may be identical in structure to the pumping circuit 96, for example. Further, the comparator part 13 may be identical in structure to the aforementioned sensing circuit 91 or 92, for example.

Thus, the semiconductor integrated circuit according to the first embodiment of the present invention changes the step-up voltage in response to change of the array voltage. Also when the array voltage VDDA is raised by temperature change in a test mode or a general mode, therefore, the step-up voltage VPP can be substantially identically raised. Thus, the difference between the step-up voltage VPP and the array voltage VDDA remains constant, whereby write charges in the memory cell can be kept constant.

The voltage obtained by dividing the step-up voltage is compared with the reference voltage based on the voltage obtained by dividing the array voltage, whereby components having smaller sizes as compared with the prior art can be used. Thus, the layout area can be suppressed. Further, the transistor may have a small absolute threshold voltage, whereby temperature dependency can be reduced.

Second Embodiment

Figure 8:
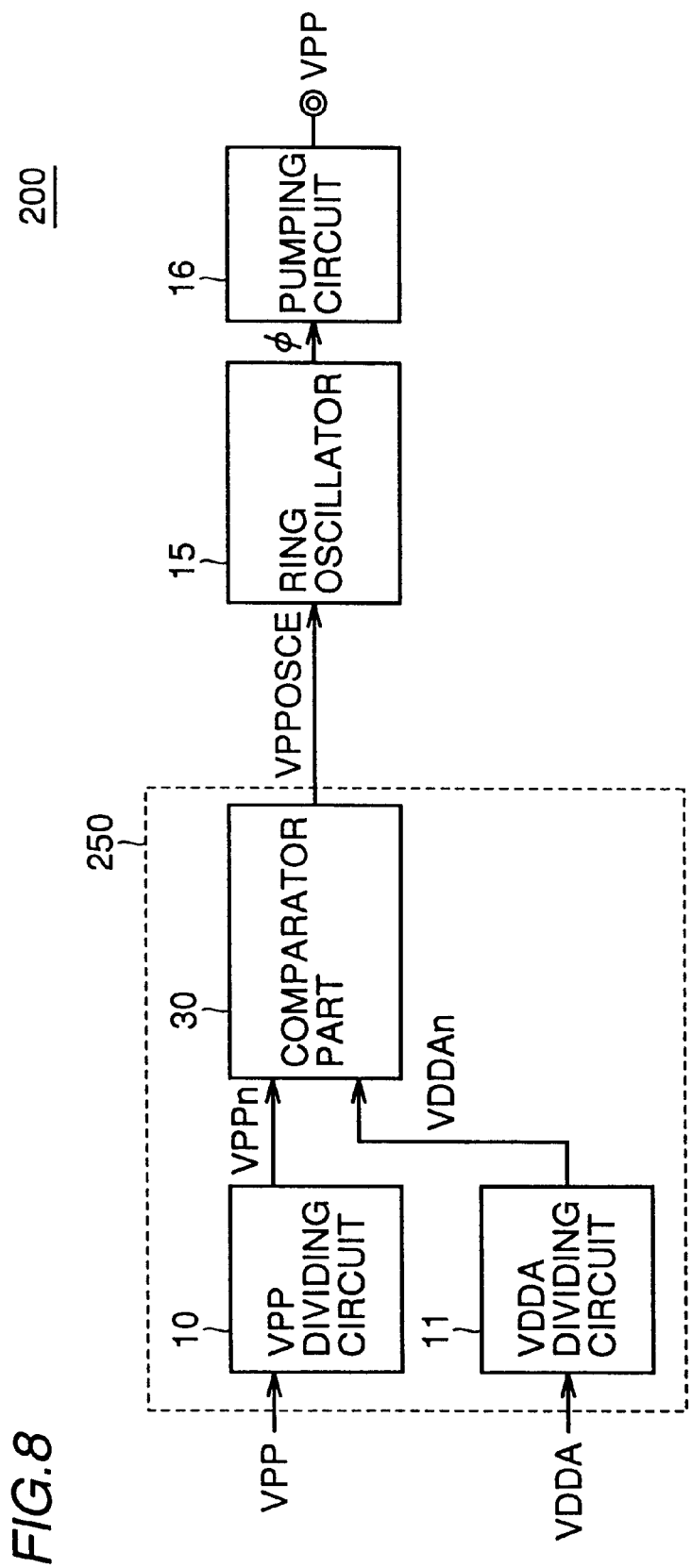
FIG. 8 is a block diagram showing an exemplary structure of a VPP generation circuit 200 according to a second embodiment of the present invention.

A VPP generation circuit 200 according to a second embodiment of the present invention is described with reference to FIG. 8. As shown in FIG. 8, the VPP generation circuit 200 according to the second embodiment of the present invention includes a sensing circuit 250 sensing the level of a step-up voltage VPP and generating an enable signal VPPOSCE, a ring oscillator 15 and a pumping circuit 16.

The sensing circuit 250 includes a VPP dividing circuit 10, a VDDA dividing circuit 11 and a comparator part 30 receiving voltages VDDAn and VPPn and outputting the enable signal VPPOSCE.

Figure 9:
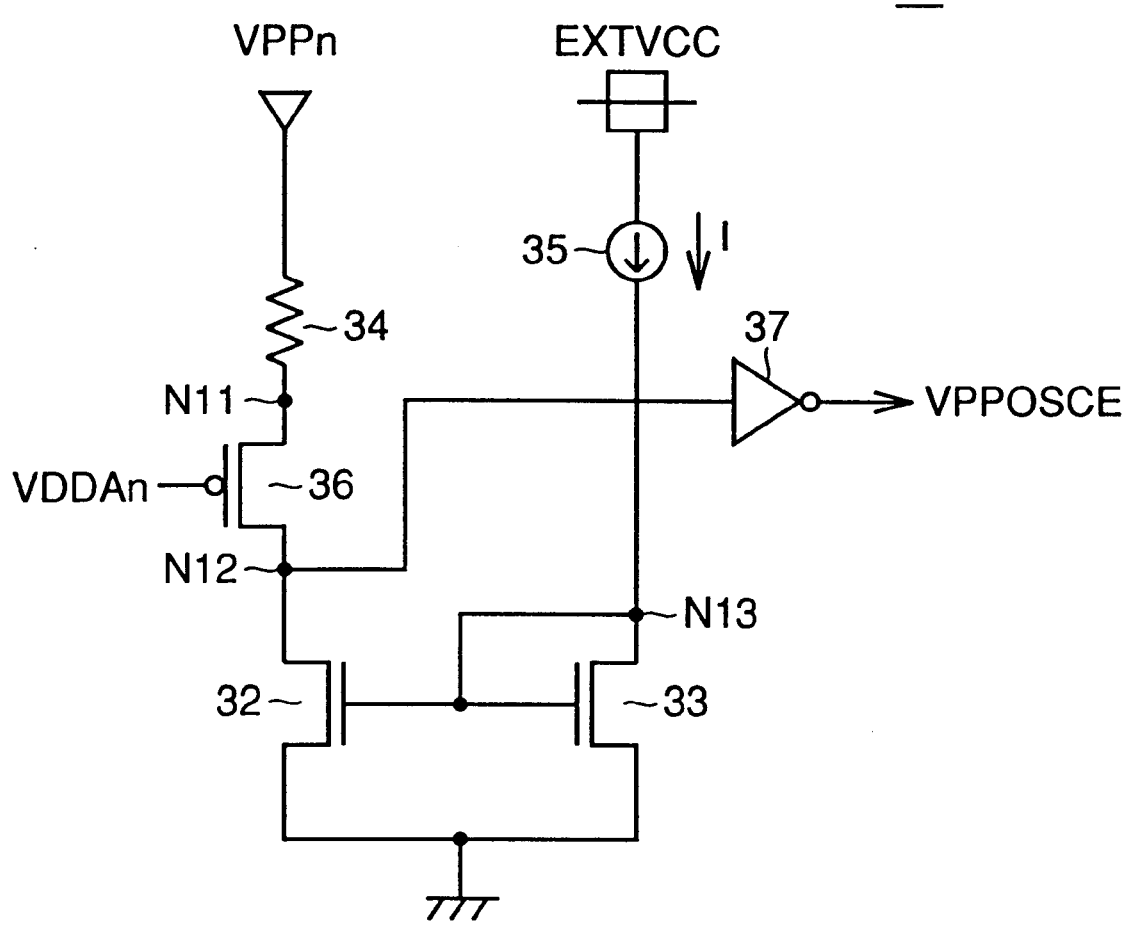
FIG. 9 is a circuit diagram showing an exemplary structure of a comparator part 30 according to the second embodiment of the present invention.

An exemplary specific structure of the comparator part 30 is described with reference to FIG. 9. The comparator part 30 shown in FIG. 9 includes a current mirror circuit, a resistive element 34 having a resistance value R, a constant current source 35 feeding a constant current I, a PMOS transistor 36 receiving the voltage VDDAn in its gate electrode and an inverter 37. The current mirror circuit is formed by transistors 32 and 33.

The resistive element 34 is connected between a node receiving the voltage VPPn and a node N11. The transistor 36 is connected between a node N12 between the transistors 36 and 32 and the node N11. The constant current source 35 is connected between a node N13 and an external power supply voltage EXTVCC. The transistor 32 is connected between the node N12 and a ground voltage GND, and the transistor 33 is connected between the node N13 and the ground voltage GND. The inverter 37 inverts a signal from the node N12 and outputs the enable signal VPPOSCE. The transistor 36 has a threshold voltage Vtp.

The current I flows through each of the transistors 32 and 33. When the current I flows to the resistive element 34, the voltage of the node N11 reaches (VPPn−R×I). If the voltage of the node N11 is higher than (VDDAn+|Vtp|), the current flows to the transistor 36.

Therefore, when VPPn−R×I is greater than VDDAn+|Vtp|, i.e., when the voltage VPPn is greater than VDDAn+|Vtp|+R×I, the signal on the node N11 goes high. In other words, a low-level signal VPPOSCE is generated.

Also in the structure according to the second embodiment of the present invention, the step-up voltage VPP can be changed depending on the array voltage VDD.

Third Embodiment

Figure 10:
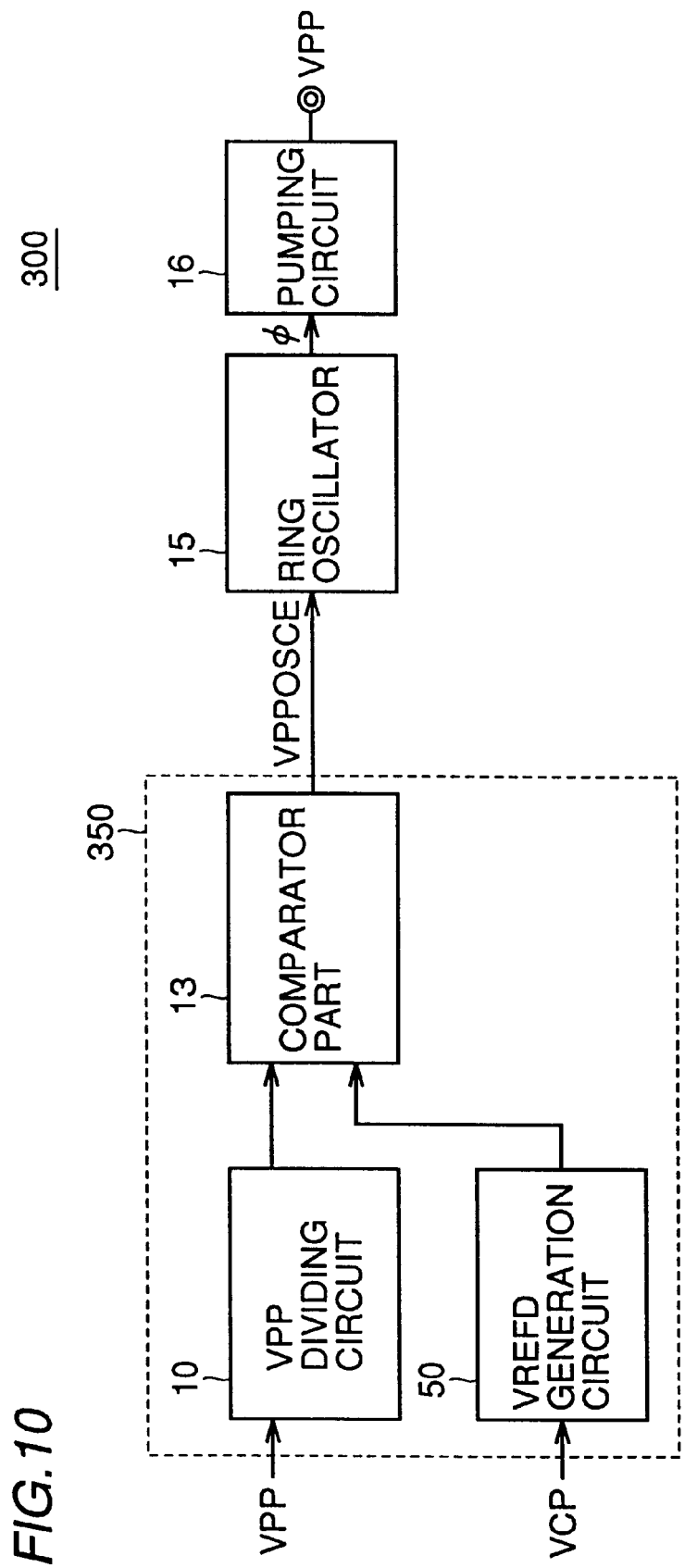
FIG. 10 is a block diagram showing an exemplary structure of a VPP generation circuit 300 according to a third embodiment of the present invention.

A VPP generation circuit 300 according to a third embodiment of the present invention is described with reference to FIG. 10. As shown in FIG. 10, the VPP generation circuit 300 according to the third embodiment of the present invention includes a sensing circuit 350 receiving a cell plate voltage VCP of a memory cell and a step-up voltage VPP and generating an enable signal VPPOSCE, a ring oscillator 15 and a pumping circuit 16.

The sensing circuit 350 includes a VPP dividing circuit 10, a VREFD generation circuit 50 generating a reference voltage VREFD in response to the cell plate voltage VCP and a comparator part 13 comparing a voltage VPPn with the reference voltage VREFD.

Figure 11:
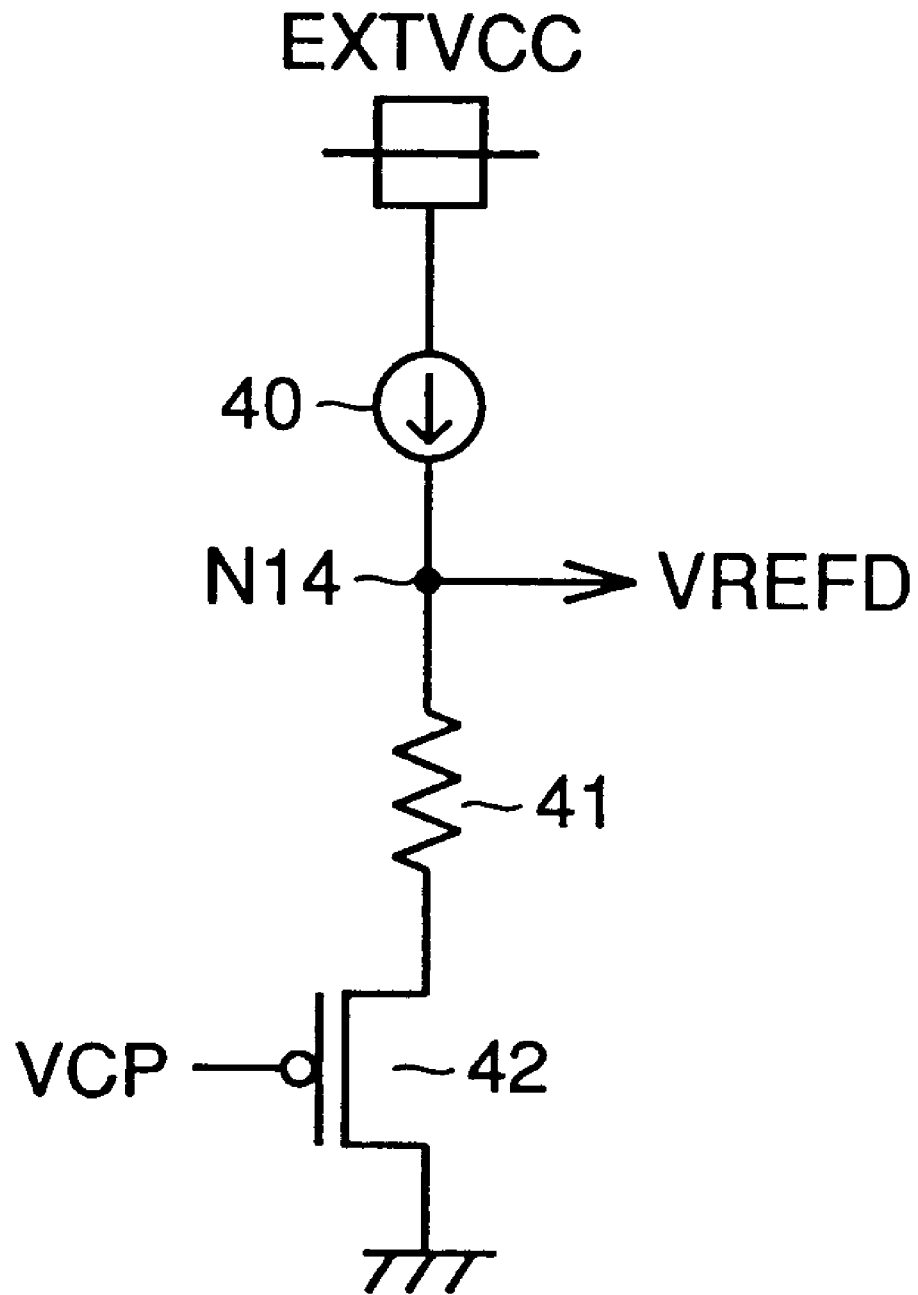
FIG. 11 is a circuit diagram showing an exemplary structure of a VREFD generation circuit 50 in the third embodiment of the present invention.

The VREFD generation circuit 50 is described with reference to FIG. 11. The VREFD generation circuit 50 shown in FIG. 11 includes a constant current source 40 feeding a current I, a resistive element 41 having a resistance value R and a PMOS transistor 42 receiving the cell plate voltage VCP in its gate electrode.

The constant current source 40 is connected between an external power supply voltage EXTVCC and a node N14. The resistive element 41 is connected between the node N14 and one conducting terminal of the transistor 42. The transistor 42 is connected between the resistive element 41 and a ground voltage GND. The node N14 generates the reference voltage VREFD. In the third embodiment of the present invention, the reference voltage VREFD is expressed as follows:

$$VREFD = VCP + |Vtp| + R \times I \quad (9)$$

The cell plate voltage VCP is set to the same level as the voltage VDDAn, i.e., (½)×VDDA. Therefore, effects similar to those of the VPP generation circuit 100 according to the first embodiment of the present invention can be attained by employing the VPP generation circuit 300. No VDDA dividing circuit 11 is required for dividing an array voltage VDDA, and hence the layout area is reduced as compared with the VPP generation circuit 100.

Fourth Embodiment

Figure 12:
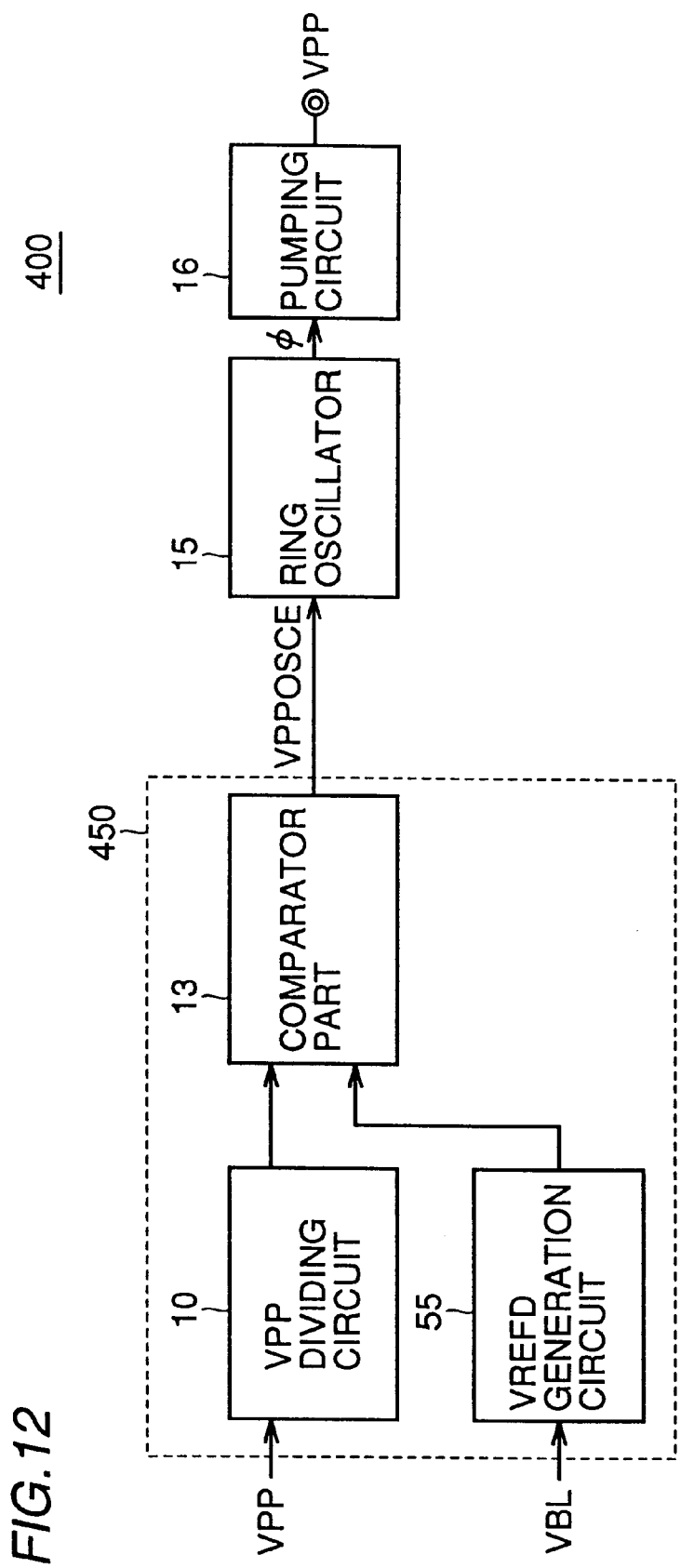
FIG. 12 is a block diagram showing an exemplary structure of a VPP generation circuit 400 according to a fourth embodiment of the present invention.

A VPP generation circuit 400 according to a fourth embodiment of the present invention is described with reference to FIG. 12. As shown in FIG. 12, the VPP generation circuit 400 according to the fourth embodiment of the present invention includes a sensing circuit 450 receiving a precharge voltage VBL for bit lines and a step-up voltage VPP and generating an enable signal VPPOSCE, a ring oscillator 15 and a pumping circuit 16.

The sensing circuit 450 includes a VPP dividing circuit 10, a VREFD generation circuit 55 generating a reference voltage VREFD in response to the precharge voltage VBL and a comparator part 13 comparing a voltage VPPn with the reference voltage VREFD.

Figure 13:
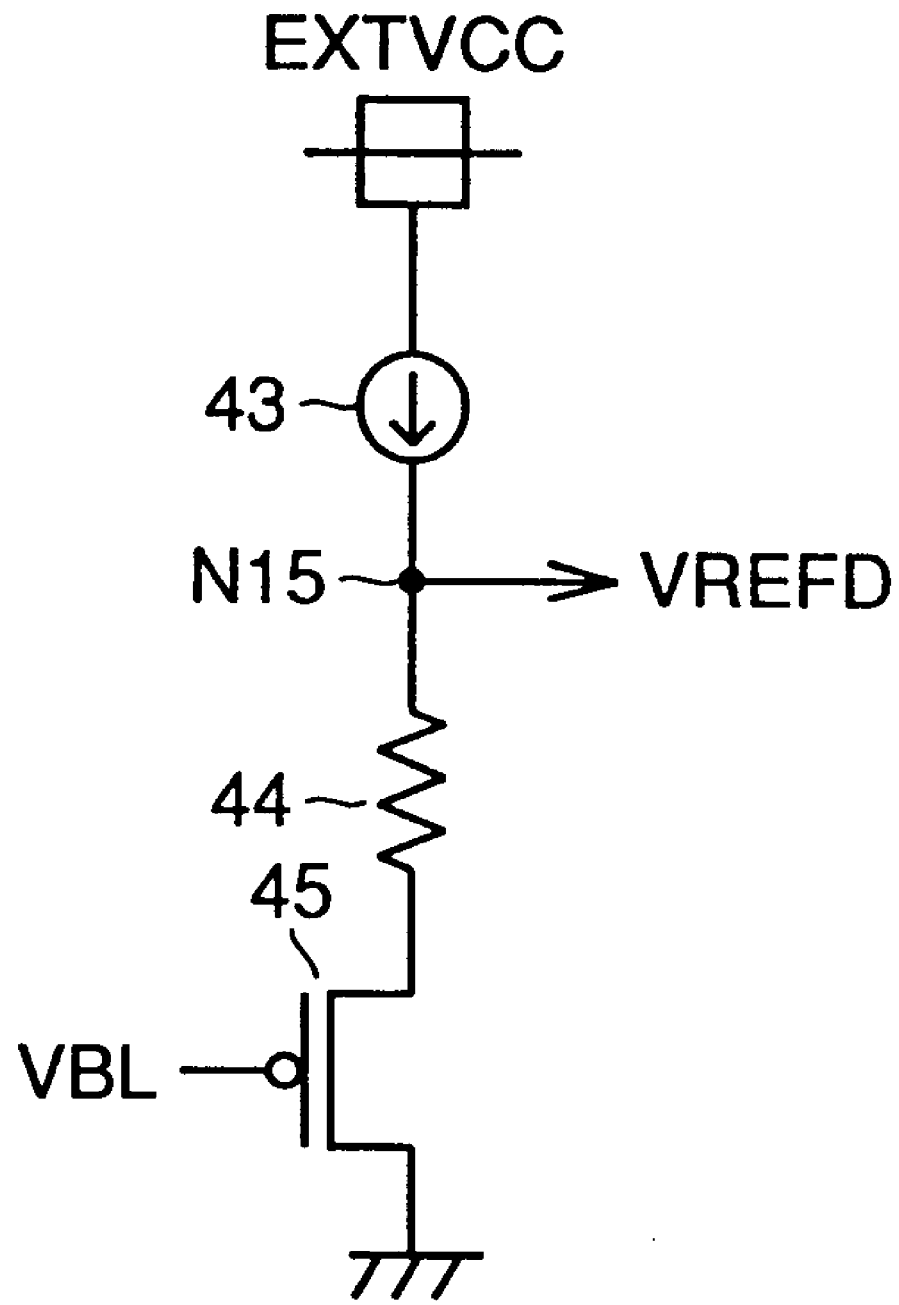
FIG. 13 is a circuit diagram showing an exemplary structure of a VREFD generation circuit 55 in the fourth embodiment of the present invention.
Figure 14:
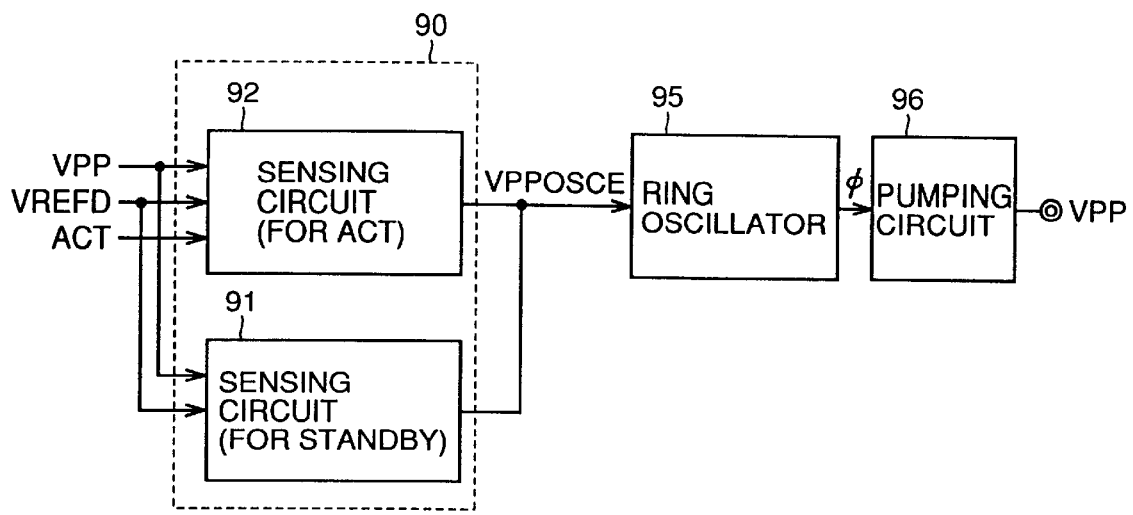
FIG. 14 is a block diagram showing the structure of a conventional VPP generation circuit.
Figure 15:
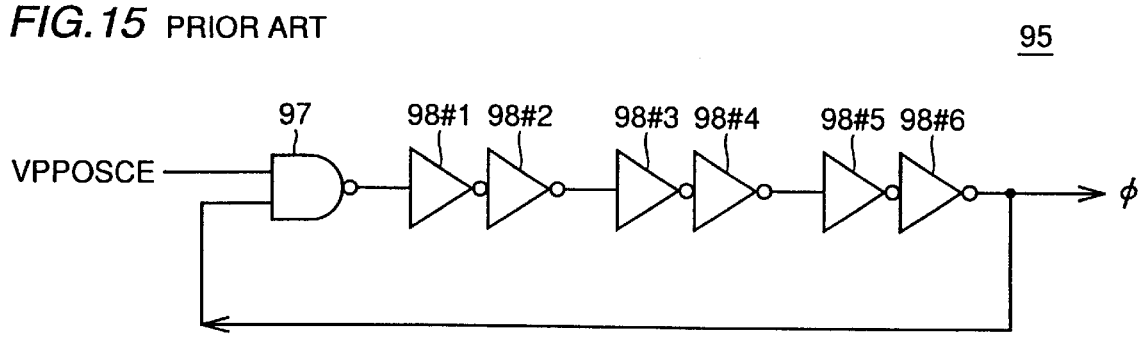
FIG. 15 is a circuit diagram showing an exemplary structure of a ring oscillator 95.
Figure 16:
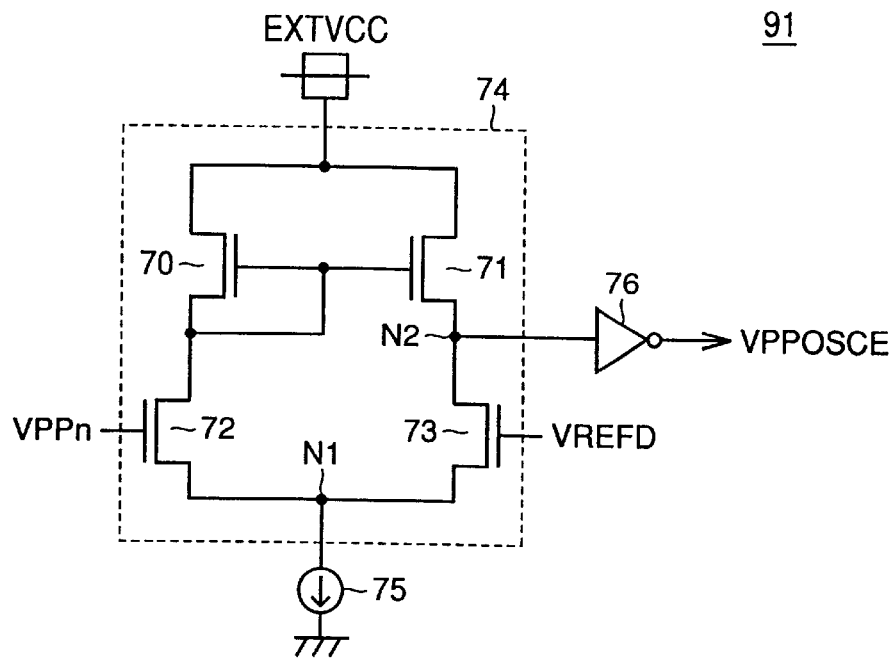
FIG. 16 is a circuit diagram showing an exemplary structure of a sensing circuit 91.
Figure 17:
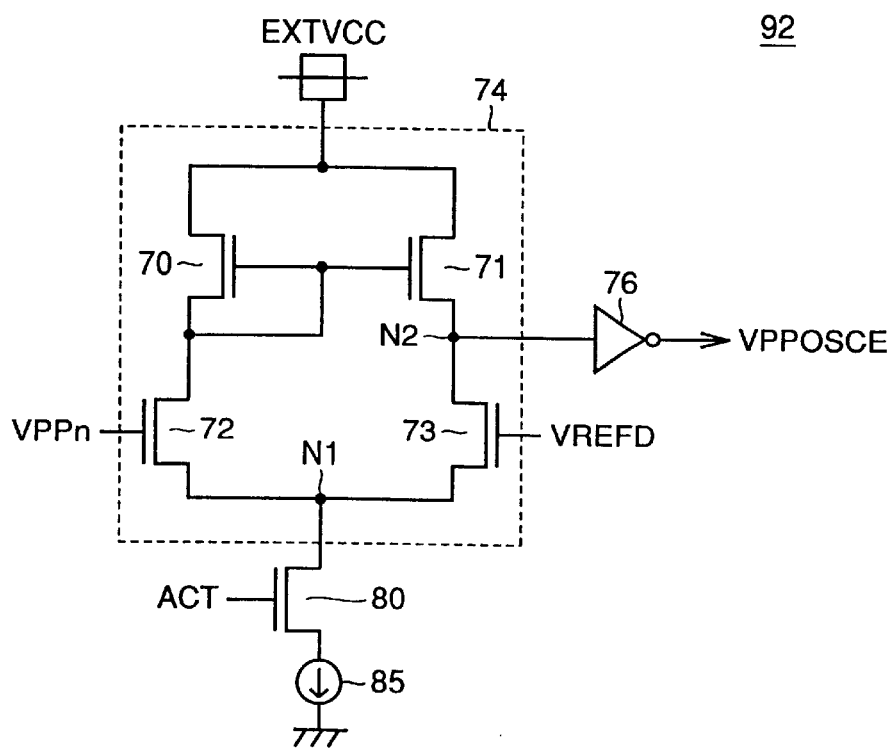
FIG. 17 is a circuit diagram showing an exemplary structure of a sensing circuit 92.
Figure 18:
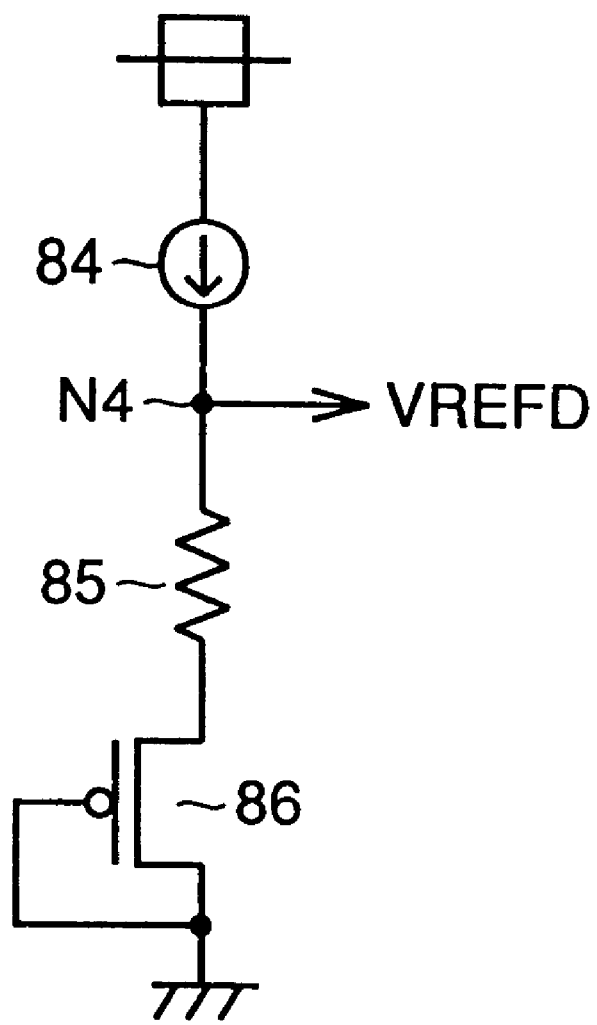
FIG. 18 is a circuit diagram showing the structure of a conventional VREFD generation circuit 850.

The VREFD generation circuit 55 is described with reference to FIG. 13. The VREFD generation circuit 55 shown in FIG. 13 includes a constant current source 43 feeding a current I, a resistive element 44 having a resistance value R and a PMOS transistor 45 receiving the precharge voltage VBL for the bit lines in its gate electrode.

The constant current source 43 is connected between an external power supply voltage EXTVCC and a node N15. The resistive element 44 is connected between the node N15 and one conducting terminal of the transistor 45. The transistor 45 is connected between the resistive element 44 and a ground voltage GND. The node N15 outputs the reference voltage VREFD. In the fourth embodiment of the present invention, the reference voltage VREFD is expressed as follows:

$$VREFD = VBL + |Vtp| + R \times I \quad (10)$$

The precharge voltage VBL is set to the same level as a voltage VDDAn, i.e., (½)×VDDA. Therefore, effects similar to those of the VPP generation circuit 100 according to the first embodiment of the present invention can be attained by employing the VPP generation circuit 400. No VDDA dividing circuit 11 is required for dividing an array voltage VDDA, and hence the layout area is reduced as compared with the VPP generation circuit 100.

While the voltage is halved in the above description, the present invention is not restricted to the case of exactly halving the voltage, depending on device conditions or a back bias effect. This also applies to the case of dividing the voltage into n.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
    a memory cell array area including a plurality of memory cells arranged in rows and columns, a plurality of word lines provided in correspondence to said rows and a plurality of bit lines provided in correspondence to said columns;
    a voltage generation circuit generating a voltage to be supplied to said memory cell array area; and
    a step-up voltage generation circuit for generating a step-up voltage, said step-up voltage generation circuit including:
        a sensing circuit sensing a level of said step-up voltage by comparing a voltage generated in accordance with an output from said voltage generation circuit and a voltage obtained by dividing said step-up voltage, and
        a circuit operating in accordance with an output of said sensing circuit for raising the level of said step-up voltage, wherein
        said step-up voltage is supplied to a selected word line among said plurality of word lines,
        said voltage generation circuit generates an array voltage to be written in a selected memory cell among said plurality of memory cells, and
    said sensing circuit includes:
        a step-up voltage dividing circuit dividing said step-up voltage,
        an array voltage dividing circuit dividing said step-up voltage,
        a reference voltage generation circuit generating a reference voltage in accordance with an output of said array voltage dividing circuit, and
        a compare circuit comparing said reference voltage with an output of said step-up voltage dividing circuit.

2. The semiconductor integrated circuit according to claim 1, wherein
    said step-up voltage dividing circuit outputs a voltage obtained by dividing said step-up voltage substantially by n, where said n represents a real number larger than 1.

3. The semiconductor integrated circuit according to claim 1, wherein
    said step-up voltage dividing circuit outputs a voltage obtained by dividing said step-up voltage substantially by n, where said n represents a real number larger than 1, and
    said array voltage dividing circuit outputs a voltage obtained by dividing said array voltage substantially by said n.

4. The semiconductor integrated circuit according to claim 3, wherein
    said reference voltage generation circuit outputs a voltage obtained by adding said voltage obtained by dividing said array voltage substantially by said n and a prescribed voltage to each other as said reference voltage.

5. A semiconductor integrated circuit comprising:
    a memory cell array area including a plurality of memory cells arranged in rows and columns, a plurality of word lines provided in correspondence to said rows and a plurality of bit lines provided in correspondence to said columns;
    a voltage generation circuit generating a voltage to be supplied to said memory cell array area; and
    a step-up voltage generation circuit for generating a step-up voltage, said step-up voltage generation circuit including:
        a sensing circuit sensing a level of said step-up voltage by comparing a voltage generated in accordance with an output from said voltage generation circuit and a voltage obtained by dividing said step-up voltage, and a circuit operating in accordance with an output of said sensing circuit for raising the level of said step-up voltage, wherein
said step-up voltage is supplied to a selected word line among said plurality of word lines,
said voltage generation circuit includes:
an internal reference voltage generation circuit generating an internal reference voltage in accordance with an external power supply voltage, and
a circuit generating an array voltage to be written in a selected memory cell among said plurality of memory cells in accordance with said internal reference voltage, and said sensing circuit includes:
a step-up voltage dividing circuit dividing said step-up voltage,
a dividing circuit dividing said internal reference voltage,
a reference voltage generation circuit generating a reference voltage in accordance with an output of said dividing circuit, and
a compare circuit comparing said reference voltage with an output of said step-up voltage dividing circuit.

6. A semiconductor integrated circuit comprising:
a memory cell array area including a plurality of memory cells arranged in rows and columns, a plurality of word lines provided in correspondence to said rows and a plurality of bit lines provided in correspondence to said columns;
a voltage generation circuit generating a voltage to be supplied to said memory cell array area; and
a step-up voltage generation circuit for generating a step-up voltage, said step-up voltage generation circuit including:
a sensing circuit sensing a level of said step-up voltage by comparing a voltage generated in accordance with an output from said voltage generation circuit and a voltage obtained by dividing said step-up voltage, and
a circuit operating in accordance with an output of said sensing circuit for raising the level of said step-up voltage, wherein
said step-up voltage is supplied to a selected word line among said plurality of word lines,
said voltage generation circuit generates an array voltage to be written in a selected memory cell among said plurality of memory cells,
said sensing circuit includes:
a step-up voltage dividing circuit dividing said step-up voltage,
an array voltage dividing circuit dividing said array voltage, and
a compare circuit comparing an output of said step-up voltage dividing circuit with an output of said array voltage dividing circuit, and said compare circuit includes:
a current mirror circuit having a first transistor and a second transistor,
a constant current source provided between said first transistor and an external power supply voltage for feeding a prescribed current,
a resistive element connected to a node receiving said output of said step-up voltage dividing circuit,
a third transistor provided between said resistive element and said second transistor for receiving said output of said array voltage dividing circuit in its gate, and
a node outputting a current flowing in said third transistor as a result of said comparison.

7. A semiconductor integrated circuit comprising:
a memory cell array area including a plurality of memory cells arranged in rows and columns, a plurality of word lines provided in correspondence to said rows and a plurality of bit lines provided in correspondence to said columns;
a voltage generation circuit generating a voltage to be supplied to said memory cell array area; and
a step-up voltage generation circuit for generating a step-up voltage, said step-up voltage generation circuit including:
a sensing circuit sensing a level of said step-up voltage by comparing a voltage generated in accordance with an output from said voltage generation circuit and a voltage obtained by dividing said step-up voltage, and
a circuit operating in accordance with an output of said sensing circuit for raising the level of said step-up voltage, wherein
each of said plurality of memory cells includes a memory cell transistor and a memory cell capacitor,
said voltage generation circuit generates a cell plate voltage of said memory cell capacitor, and
said sensing circuit compares said cell plate voltage with a voltage obtained by dividing said step-up voltage.

8. The semiconductor integrated circuit according to claim 7, wherein
said step-up voltage is supplied to a selected word line among said plurality of word lines, and
said sensing circuit includes:
a step-up voltage dividing circuit outputting a voltage obtained by substantially halving said step-up voltage,
a reference voltage generation circuit generating a reference voltage in accordance with said cell plate voltage, and
a compare circuit comparing said reference voltage with said output of said step-up voltage dividing circuit.

9. The semiconductor integrated circuit according to claim 8, wherein
said cell plate voltage is a voltage substantially half an array voltage to be written in selected said memory cell.

10. The semiconductor integrated circuit according to claim 8, wherein
said reference voltage generation circuit outputs a voltage obtained by adding a prescribed voltage to said cell plate voltage as said reference voltage.

11. A semiconductor integrated circuit comprising:
a memory cell array area including a plurality of memory cells arranged in rows and columns, a plurality of word lines provided in correspondence to said rows and a plurality of bit lines provided in correspondence to said columns;
a voltage generation circuit generating a voltage to be supplied to said memory cell array area; and
a step-up voltage generation circuit for generating a step-up voltage, said step-up voltage generation circuit including:
a sensing circuit sensing a level of said step-up voltage by comparing a voltage generated in accordance with an output from said voltage generation circuit and a voltage obtained by dividing said step-up voltage, and a circuit operating in accordance with an output of said sensing circuit for raising the level of said step-up voltage, wherein said voltage generation circuit generates a precharge voltage supplied to said plurality of bit lines, and said sensing circuit compares said precharge voltage with a voltage obtained by dividing said step-up voltage.

12. The semiconductor integrated circuit according to claim 11, wherein said step-up voltage is supplied to a selected word line among said plurality of word lines, said sensing circuit includes:
- a step-up voltage dividing circuit outputting a voltage obtained by substantially halving said step-up voltage,
- a reference voltage generation circuit generating a reference voltage in accordance with said precharge voltage, and
- a compare circuit comparing said reference voltage with said output of said step-up voltage dividing circuit.

13. The semiconductor integrated circuit according to claim 12, wherein said precharge voltage is a voltage substantially half an array voltage to be written in selected said memory cell.

14. The semiconductor integrated circuit according to claim 12, wherein said reference voltage generation circuit outputs a voltage obtained by adding a prescribed voltage to said precharge voltage as said reference voltage.

15. A semiconductor integrated circuit comprising:

a circuit to which a first voltage and a second voltage are applied;

a charge supply circuit supplying said first voltage;

a first dividing circuit dividing said first voltage to output a third voltage;

a second dividing circuit dividing said second voltage to output a fourth voltage;

a comparison circuit comparing said third voltage output from said first dividing circuit and a fifth voltage formed based on said fourth voltage output from said second dividing circuit, to control said first voltage supplied by said charge supply circuit.

16. The semiconductor integrated circuit according to claim 15, wherein said first voltage is higher than said second voltage.

17. The semiconductor integrated circuit according to claim 15, wherein said circuit to which said first voltage and said second voltage are applied comprises a memory cell array including a plurality of memory cells arranged in rows and columns.

18. The semiconductor integrated circuit according to claim 17, wherein said memory cells each include a transistor, said first voltage is a voltage applied to a plurality of word lines each provided corresponding to the row direction of the memory cell array and each connected to respective gate electrodes of said transistors in the corresponding row direction, said second voltage is a voltage applied to a plurality of bit lines each provided corresponding to the column direction of the memory cell array and each connected to respective one conductive terminals of said transistors in the corresponding column direction.

19. A semiconductor integrated circuit comprising:

a circuit to which a first voltage and a second voltage are applied;

a charge supply circuit supplying said first voltage;

a first dividing circuit dividing said first voltage to output a third voltage;

a second dividing circuit dividing said second voltage to output a fourth voltage;

a comparison circuit using said third voltage output from said first dividing circuit and said fourth voltage output from said second dividing circuit, to control said first voltage supplied by said charge supply circuit.

20. The semiconductor integrated circuit according to claim 19, wherein said first voltage is higher than said second voltage.

21. The semiconductor integrated circuit according to claim 19, wherein said circuit to which said first voltage and said second voltage are applied comprises a memory cell array including a plurality of memory cells arranged in rows and columns.

22. The semiconductor integrated circuit according to claim 21, wherein said memory cells each include a transistor, said first voltage is a voltage applied to a plurality of word lines each provided corresponding to the row direction of the memory cell array and each connected to respective gate electrodes of said transistors in the corresponding row direction, said second voltage is a voltage applied to a plurality of bit lines each provided corresponding to the column direction of the memory cell array and each connected to respective one conductive terminals of said transistors in the corresponding column direction.

* * * * *